US008791762B2

(12) United States Patent
Rebel et al.

(10) Patent No.: US 8,791,762 B2
(45) Date of Patent: Jul. 29, 2014

(54) METHOD AND APPARATUS FOR MANAGING ARBITRARY FREQUENCIES

(75) Inventors: Reimund Rebel, Maricopa, AZ (US); Klaus Juergen Schoepf, Chandler, AZ (US)

(73) Assignee: Sand 9, Inc., Cambridge, MA (US)

( * ) Notice: Subject to any disclaimer, the term of this patent is extended or adjusted under 35 U.S.C. 154(b) by 178 days.

(21) Appl. No.: 13/272,587

(22) Filed: Oct. 13, 2011

(65) Prior Publication Data

US 2013/0093468 A1 Apr. 18, 2013

(51) Int. Cl.
*H03L 7/00* (2006.01)

(52) U.S. Cl.
USPC .................. 331/2; 331/18; 331/25; 331/46

(58) Field of Classification Search
USPC ................ 331/1 A, 34, 2, 18, 25, 46; 327/156–160, 115, 147
See application file for complete search history.

(56) References Cited

U.S. PATENT DOCUMENTS

| | | | | |
|---|---|---|---|---|
| 4,211,975 A | * | 7/1980 | Kuroda | 455/75 |
| 6,154,095 A | * | 11/2000 | Shigemori et al. | 331/16 |
| 7,602,226 B1 | * | 10/2009 | Hwang et al. | 327/291 |
| 2005/0186918 A1 | * | 8/2005 | Ramet et al. | 455/76 |
| 2007/0035345 A1 | | 2/2007 | Siddall | |
| 2007/0057830 A1 | * | 3/2007 | Wiesbauer et al. | 341/126 |
| 2010/0156481 A1 | | 6/2010 | Neumann | |
| 2011/0080528 A1 | | 4/2011 | Deleon | |
| 2012/0032715 A1 | * | 2/2012 | Subburaj et al. | 327/115 |

* cited by examiner

*Primary Examiner* — Joseph Chang
*Assistant Examiner* — Jeffrey Shin
(74) *Attorney, Agent, or Firm* — Wolf, Greenfield & Sacks, P.C.

(57) ABSTRACT

Frequency synthesizers for use with oscillators that generate an arbitrary frequency are described, as well as related devices and methods. Divider information can be generated or otherwise accessed for use in configuring a phase lock loop device that is adapted for coupling with the oscillator, where the phase lock loop device can include a plurality of integer dividers without utilizing a fractional divider, where the divider information can include frequency deviations corresponding to groups of integer divider settings for the phase lock loop device, and where each deviation of the frequency deviations can be based on a frequency differential between a standard operating frequency and an output frequency for the phase lock loop utilizing one group of integer divider settings from the groups of integer divider settings.

16 Claims, 10 Drawing Sheets

METHOD AND APPARATUS FOR MANAGING ARBITRARY FREQUENCIES

FIELD OF THE DISCLOSURE

The present disclosure relates generally to oscillators, and more particularly, to a method and apparatus for utilizing frequency synthesizers to manage arbitrary frequencies generated by oscillators.

BACKGROUND

Oscillators are utilized in a large number of electronic equipment, including communications systems (e.g., wireless and wireline), entertainment electronics, aerospace systems, and timing systems. Oscillators can be utilized to provide a reference signal (e.g., a clock signal) for processing occurring in the electronic equipment. Due to the type of use of the oscillators, precision of the signal frequency associated with the oscillator can be a significant requirement.

Crystal oscillators having quartz crystals as the resonating element often are utilized in the electronic equipment because they are often capable of being manufactured to provide signal frequencies within ±1.5 parts-per-million (ppm) of a target frequency value, frequency stabilities of ±2.5 ppm over an operating temperature range from −40° C. to +85° C., aging of below ±1 ppm/year (at 25° C.), typical phase noise of −138 dBc/Hz at 1 kHz, and power consumption as low as 1.5 mA.

Various industries have developed standards and protocols that are based on use of particular or standard frequencies for reference signals and clock signals. For instance, frequency values can be as low as 32.768 kHz for watch crystals and real time clocks. Frequencies in the MHz range are commonly used in cell phones and GPS receivers, including 12.6 MHz, 13 MHz, 14.4 MHz, 16 MHz, 16.368 MHz, 16.9 MHz, 19.2 MHz, 19.8 MHz, 20 MHz, 23.104 MHz, 24.554 MHz, 26 MHz, 27.456 MHz, 32 MHz, 33.6 MHz, 38.4 MHz, and 52 MHz. Owing to the ability to manufacture quartz crystals to provide a desired target frequency, crystal oscillators are often manufactured to provide one of the several standard frequencies. Systems and circuits receiving signals from crystal oscillators are often designed to work with one of the standard frequencies corresponding to the particular crystal oscillator being utilized.

As an example, FIG. 1 illustrates a conventional apparatus 100 including an oscillator 102 coupled with a system 106. An input port 105 of the system 106 receives an oscillator signal 104 output from an output port 103 of the oscillator 102. In this example, the system 106 is designed to work with a signal of precisely 26 MHz. Therefore, a 26 MHz oscillator is selected for the oscillator 102. If the system 106 receives a different frequency, it may not operate properly.

Fractional-N phase lock loops are at times utilized in contemporary devices since they can at times compare at a high frequency, and can at times reduce phase noise due to the phase frequency detector operating at a higher frequency and the multiplication factor being lower. Due to the use of a sigma delta modulator to toggle divider settings both, phase noise and spurious emissions may also deteriorate significantly at narrower step sizes.

Figure 1:
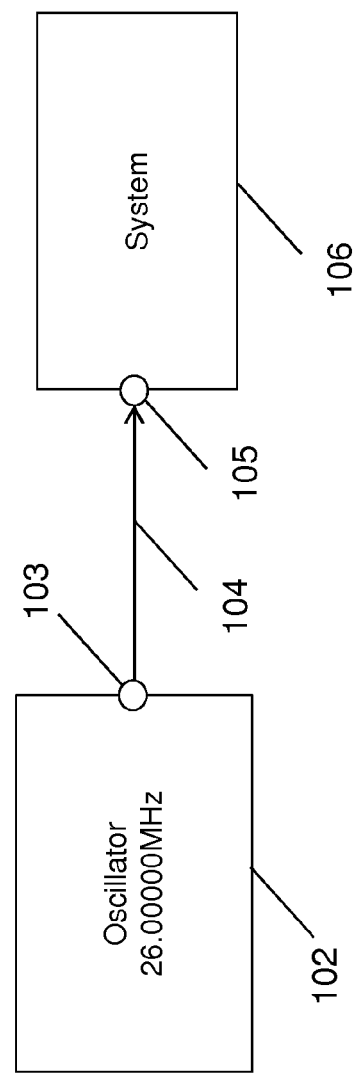
FIG. 1 illustrates a conventional configuration of an oscillator providing an oscillating signal having a standard frequency to a system.

In the drawings, the same reference numbers identify identical and/or substantially similar elements or acts. The drawings illustrate particular embodiments for the purpose of describing the present disclosure, and are not intended to be exclusive or limiting in any way. The figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the present disclosure shown where illustration is not necessary to allow those of ordinary skill in the art to understand the disclosure.

In the course of the detailed description to follow, reference will be made to the attached drawings. These drawings show different aspects of the present disclosure and, where appropriate, reference numerals illustrating like structures, components, materials and/or elements in different figures are labeled similarly. It should be understood that various combinations of the structures, components, materials and/or elements, other than those specifically shown, are contemplated and are within the scope of the present disclosure.

DETAILED DESCRIPTION

Frequency synthesizers usable with oscillators providing an arbitrary frequency, as well as related devices and methods, are described herein. The arbitrary frequency can be any frequency that deviates or is otherwise offset from the standard operating frequency used by the particular electronic equipment. One or more of the frequency synthesizers of the exemplary embodiments utilize integer dividers without utilizing fractional dividers, which can be advantageous due to the simplicity of the configuration of the frequency synthesizer. One or more of the exemplary embodiments can also provide for a comparison at a higher frequency, while still generating narrow step sizes.

A number of different configurations and/or components can be used for the frequency synthesizers, such as using three or more integer dividers without utilizing fractional dividing (e.g., without using an accumulator or a sigma delta modulator). Rather than selecting divider values or factors in a phase lock loop to generate a constant step size which may limit the number of possible divider settings to generate frequencies on a grid with a certain step size, one or more embodiments described herein can forego the use of the constant step size and can generate frequencies on different grids for the frequency synthesizer. By considering use of all the possible grids, the spacing between the possible frequencies can be made much smaller than a comparison frequency of a contemporary phase lock loop.

By selecting different divider ratios, the frequency output for the frequency synthesizer can be set close to the desired output frequency while still maintaining a higher comparison frequency at the phase frequency detector. In one embodiment, any remaining frequency error or deviation can be eliminated or reduced, if desired, by tuning of the reference oscillator frequency or other adjusting techniques.

In one exemplary embodiment of the present disclosure, a method is provided that can include obtaining a phase lock loop device operable for coupling with an oscillator that generates an arbitrary frequency, where the phase lock loop device comprises a plurality of integer dividers without utilizing a fractional divider. The method can also include accessing divider information comprising groups of integer divider settings and frequency deviations corresponding to each of the groups of integer divider settings, where the groups of integer divider settings are for at least three integer dividers of the phase lock loop device, and where each deviation of the frequency deviations is based on a frequency differential between a standard operating frequency and an output frequency for the phase lock loop utilizing one group of integer divider settings from the groups of integer divider settings. The method can further include determining operating parameters for the phase lock loop device. The method can include selecting a desired group of integer divider settings from the groups of integer divider settings based on the frequency differential and the operating parameters of the phase lock loop device.

In another exemplary embodiment of the present disclosure, a method is provided that can include selecting divider settings from pre-determined divider information for a plurality of integer dividers of a phase lock loop device of a frequency synthesizer. The frequency synthesizer can be operable to receive an arbitrary frequency generated by an oscillator. The frequency synthesizer can operate without utilizing a fractional divider. The pre-determined divider information can include frequency deviations corresponding to groups of integer divider settings for the phase lock loop device. Each deviation of the frequency deviations can be based on a frequency differential between a standard operating frequency and an output frequency for the phase lock loop utilizing one group of integer divider settings from the groups of integer divider settings. The method can also include configuring the phase lock loop device based on the selected divider settings.

In another exemplary embodiment of the present disclosure, a non-transitory computer-readable storage medium is provided that includes computer instructions which when executed by a processor cause the processor to generate divider information for use in configuring a phase lock loop device that is adapted for coupling with an oscillator that generates an arbitrary frequency, where the phase lock loop device comprises a plurality of integer dividers without utilizing a fractional divider, where the divider information comprises frequency deviations corresponding to groups of integer divider settings for the phase lock loop device. Each deviation of the frequency deviations can be based on a frequency differential between a standard operating frequency and an output frequency for the phase lock loop utilizing one group of integer divider settings from the groups of integer divider settings.

Figure 2:
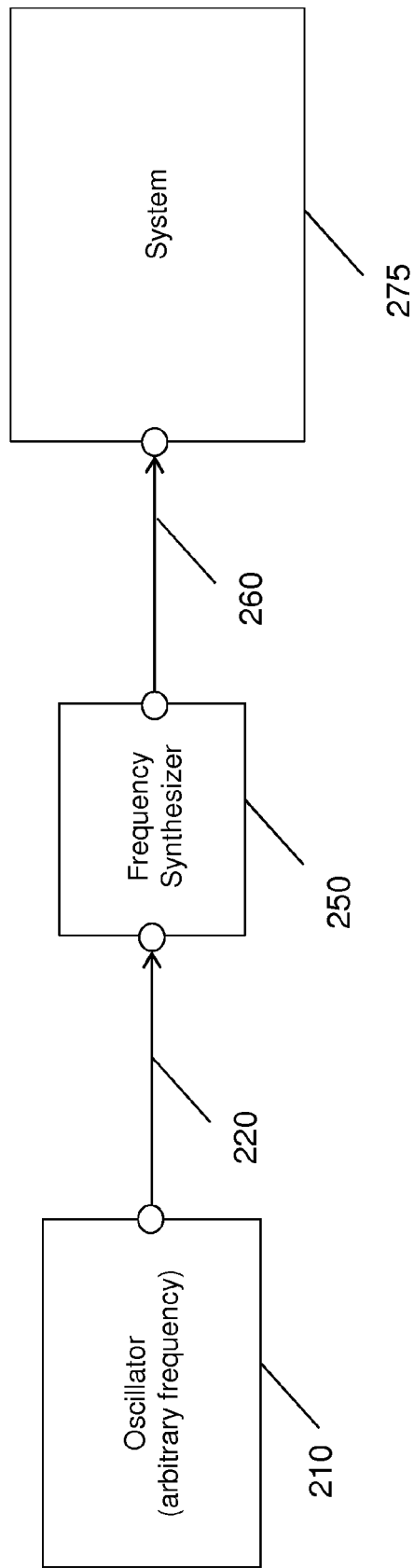
FIG. 2 illustrates an exemplary embodiment of a frequency synthesizer that can enable a system to operate using an arbitrary frequency of an oscillator.

FIG. 2 illustrates a frequency synthesizer or phase lock loop device 250 coupled with an oscillator 210 and a system 275. The frequency synthesizer 250 can receive an arbitrary frequency 220 which is processed to generate an output frequency 260 that is usable by the system 275.

The frequency synthesizer 250 can include a phase lock loop having a plurality of integer dividers, which enables selection of divider settings to achieve a desired output frequency. In one or more embodiments, a number of different configurations and/or components can be used for the frequency synthesizer 250 without utilizing fractional dividing (e.g., without using an accumulator or a sigma delta modulator). The divider settings can be selected from a look-up table or other storage medium containing divider information comprising groups of divider settings and a resulting frequency deviation between a standard operating frequency for the system 275 and the output frequency from the frequency synthesizer 250 using the particular divider settings of each group.

Other factors can be utilized in generating and/or selecting the divider settings to achieve the desired output frequency. For instance, frequency operating ranges of components of the phase lock loop, noise, spurious emissions and so forth, can be considered in the generation of the divider information and/or the selection of the divider settings. The phase lock loop of the frequency synthesizer 250 can include other components, such as one or more phase frequency detectors, one or more low pass filter, one or more voltage controllable oscillators, a mixer and/or a multiplier. The selection of the configuration and/or components of the frequency synthesizer 250 can depend on a number of factors including frequency operating ranges of components of the phase lock loop, noise, spurious emissions, power consumption, harmonics and so forth.

The oscillator 210 generating the arbitrary frequency can be of various types, such as oscillators using quartz crystal resonators, bulk acoustic wave (BAW) resonators, surface acoustic wave (SAW) resonators, plate acoustic wave (PAW) resonators, (thin) film plate acoustic resonators (FPAR), film bulk acoustic resonators (FBAR), solid mounted resonators (SMR), contour mode resonators (CMR), thin-film piezoelectric on silicon (TPoS), microelectromechanical systems (MEMS) technology, or any other type of resonator technology that uses mechanical vibrations in a solid to excite a resonance frequency and use this as a frequency reference in the oscillator. It should further be understood that as used herein the term "mechanical resonator" encompasses at least quartz crystal resonators, BAW, SAW, PAW, SMR, FPAR, FBAR, CMR, thin-film piezoelectric on silicon (TPoS) resonator technology, and MEMS resonators. According to some embodiments, the oscillator may include a mechanical resonator comprising or formed of one or more of the following materials: Quartz, Langasite, Silicon, Silicon oxide, Aluminum Nitride, Lithium Tantalate, Lithium Niobate, Zinc oxide, Gallium Arsenide, Cadmium Sulfide, Germanium. Other resonator technologies may also be used.

Further, other suitable oscillators or mechanical resonating structures have been described, for example, in International Publication No. WO 2006/083482, U.S. patent application Ser. No. 12/181,531, filed Jul. 29, 2008, and in U.S. patent application Ser. No. 12/142,254, filed Jun. 19, 2008 and published Oct. 1, 2009 as U.S. Patent Application Publication 2009-0243747, which are incorporated herein by reference in their entireties. It should be understood that a number of different designs for the oscillator or mechanical resonating structure are also suitable.

The standard operating frequency that is sought to be achieved or approximated by frequency synthesizer 250 can vary depending on standards, protocols, industry type and so forth. For example, the standard operating frequency can be, but is not limited to, frequencies of 12 MHz, 12.6 MHz, 13 MHz, 14.4 MHz, 16 MHz, 16.368 MHz, 16.9 MHz, 19.2 MHz, 19.8 MHz, 20 MHz, 23.104 MHz, 24 MHz, 24.554 MHz, 26 MHz, 27 MHz, 27.456 MHz, 32 MHz, 33.6 MHz, 38.4 MHz, 52 MHz, 669.3266 MHz, any other standard oscillator frequency, or any other frequency or frequencies of interest.

The oscillator 210, the frequency synthesizer 250 and/or the system 275 may be formed as separate components, such as on separate semiconductor dies or the oscillator, the frequency synthesizer and/or the system may be formed as integrated components, such as on the same semiconductor die.

Figure 3:
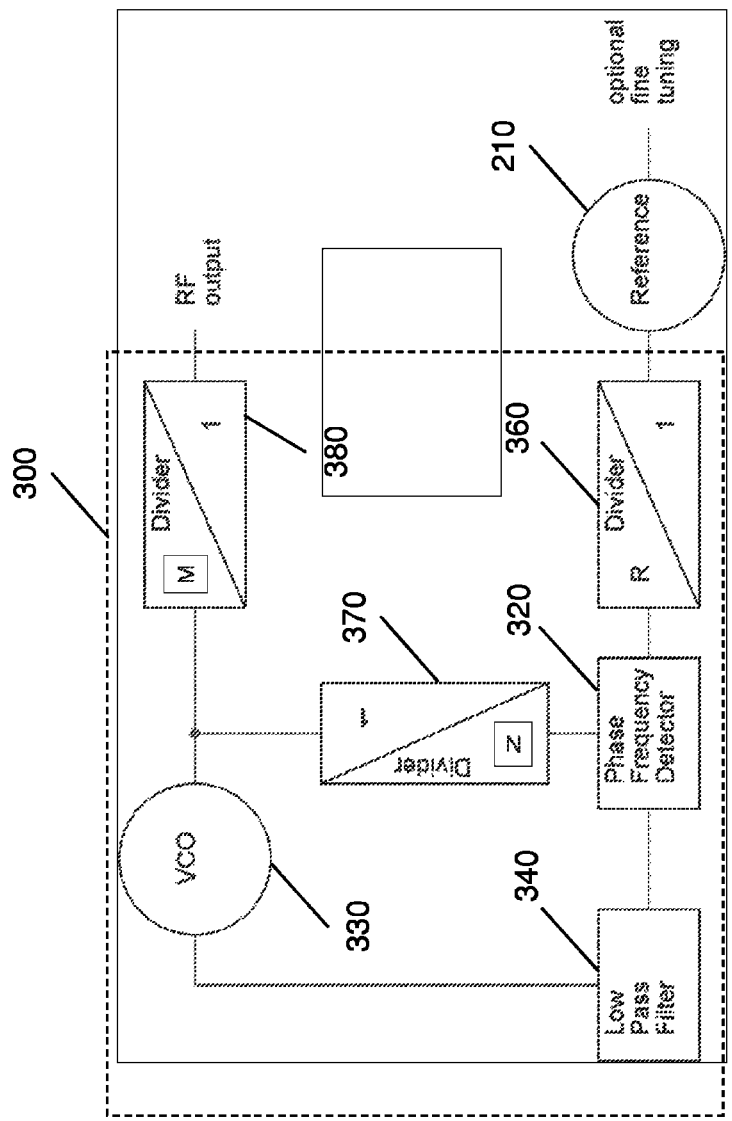
FIG. 3 illustrates an exemplary embodiment of another frequency synthesizer that can enable the system of FIG. 2 to operate using an arbitrary frequency of the oscillator of FIG. 2.

FIG. 3 illustrates a frequency synthesizer or phase lock loop device 300 that can be used with the oscillator 210 and system 275 of FIG. 2. In this embodiment, the frequency synthesizer 300 can include a phase lock loop that has a phase frequency detector 320 and a voltage controllable oscillator 330 with a low pass filter 340 positioned therebetween. The phase lock loop can also include an integer divider 360 positioned between the oscillator 210 and the phase frequency detector 320, as well as an integer divider 370 positioned in a feedback loop between the voltage controllable oscillator 330 and the phase frequency detector 320. The frequency synthesizer 300 can include an integer divider 380 positioned downstream of the voltage controllable oscillator 330. Based on this particular configuration and the use of the three integer dividers, frequency synthesizer 300 can produce an output frequency ($f_{out}$) determined by the following formula:

$$f_{out} = f_{ref} * N/(R*M) \quad [1]$$

where $f_{ref}$ is the arbitrary frequency generated by oscillator 210, N is a divider value for integer divider 370, R is a divider value for integer divider 360 and M is a divider value for integer divider 380.

In this embodiment, a frequency deviation consisting of the difference between a standard operating frequency (e.g., 26 MHz) and the output frequency, $f_{out}$, can be pre-determined based on varying the divider values for N, R and/or M. Groupings of these divider values along with the corresponding frequency deviation can be stored (e.g., in a look-up table) for later use in configuring electronic equipment that utilizes the frequency synthesizer 300 with an oscillator where the arbitrary frequency, $f_{ref}$, of the oscillator is known. As will be described later, fine tuning techniques can be utilized for the output frequency, such as where the output frequency does not satisfy an operational threshold for the system 275. The fine tuning techniques can include adjusting a sampling rate of a digital-to-analog converter of the system 275 when the output frequency does not satisfy the operational threshold.

As an example of an embodiment of fine tuning in a cellular phone or other transmission device, the sampling rate of a Digital-to-Analog Converter (DAC) in a transmit path of the device may be selected to account for an up-conversion process performed in the transmit path using the oscillating reference signal having the arbitrary frequency. The up-conversion process may be performed by suitable mixing of an analog signal including analog data, such as a cellular telephone signal or other analog signal to be transmitted, with the oscillating reference signal, resulting in an up-converted signal at a desired carrier frequency. The analog signal itself may be generated by performing digital-to-analog conversion of a digital signal having the desired data for transmission. The transmit path may be designed to operate with an oscillating reference signal having a standard oscillator frequency, such that if the oscillating reference signal instead has an arbitrary frequency the data of the resulting up-converted signal may be shifted in the frequency domain relative to the center frequency of the desired carrier frequency. Such a shift may be accounted for by suitable selection of the sampling rate of the DAC prior to up-conversion, such that the data of the up-converted signal appears at the intermediate frequency. For example, if the arbitrary frequency of the oscillating reference signal is higher than an expected standard oscillator frequency, then the sampling rate of the DAC may be selected to be lower than if the oscillating reference signal had the expected standard oscillator frequency, and vice versa. Additional details as to fine tuning and other methods and components that can be utilized in conjunction with, or in place of, one or more of the components and steps described in the exemplary embodiments herein, are described in U.S. Patent Application Publication No. 20110148531 filed on Mar. 10, 2010, the disclosure of which is hereby incorporated by reference.

As another example of an embodiment of fine tuning in a cellular phone or other transmission device, a digital shift of data to be transmitted from a transmit path of the device may be induced to account for an up-conversion process performed using the reference oscillating signal having the arbitrary frequency. A digital data signal having digital data to be transmitted may be generated. The digital data signal may be digital-to-analog converted using a DAC and then up-converted by mixing with a suitable oscillating reference signal. The device may be designed in expectation of the oscillating reference signal having a standard oscillator frequency. In the event the oscillating reference signal has the arbitrary frequency, the up-conversion process may result in the data to be transmitted being shifted in the frequency domain relative to the center frequency of the intended carrier frequency. To account for such a shift, a Digital Signal Processor (DSP) may be used to shift, in the frequency domain, the digital data of the digital data signal prior to the digital-to-analog conversion. By suitable selection of the amount of frequency shift to induce in the digital data signal, the subsequent DAC conversion and up-conversion using an oscillating reference signal of arbitrary frequency may result in the data of the up-converted signal appearing at a desired frequency or frequencies (e.g., near the center frequency of the desired carrier frequency).

Frequency synthesizer 300 can enable selection of divider values for the plurality of integer dividers to achieve a desired output frequency without the need to utilize fractional dividing technology. Additionally, the desired output frequency of the frequency synthesizer 300 does not need to correspond to the smallest frequency deviation between the standard operating frequency and the output frequency, although in some cases it could be based only on the smallest frequency deviation. However, in other embodiments, other factors can be considered when selecting the desired output frequency, including reduction of spurious emissions, reduction of noise, the frequency operating range of the voltage controllable oscillator, frequency operating range of one or more of the integer dividers, the frequency operating range of the phase frequency detector, and so forth.

For example in one embodiment, one or more of these factors, such as spurious emissions and noise, can be considered in the selection of the particular output frequencies based on groups of divider values. A determination can be made to select a first group of divider values with a larger frequency deviation than a second group of divider values due to a more beneficial operation of the frequency synthesizer 300 and/or operation of the electronic equipment with respect to the spurious emissions and the noise for the first group of divider values rather than the second group of divider values. In one embodiment, the various factors can be weighed, including the frequency deviation, the noise, the power consumption and/or the spurious emissions, to select the output frequency and the corresponding divider values which achieve the selected output frequency. The weighing of the factors can be based on the type of electronic component, the standard operating frequency, and/or other criteria.

Figure 4:
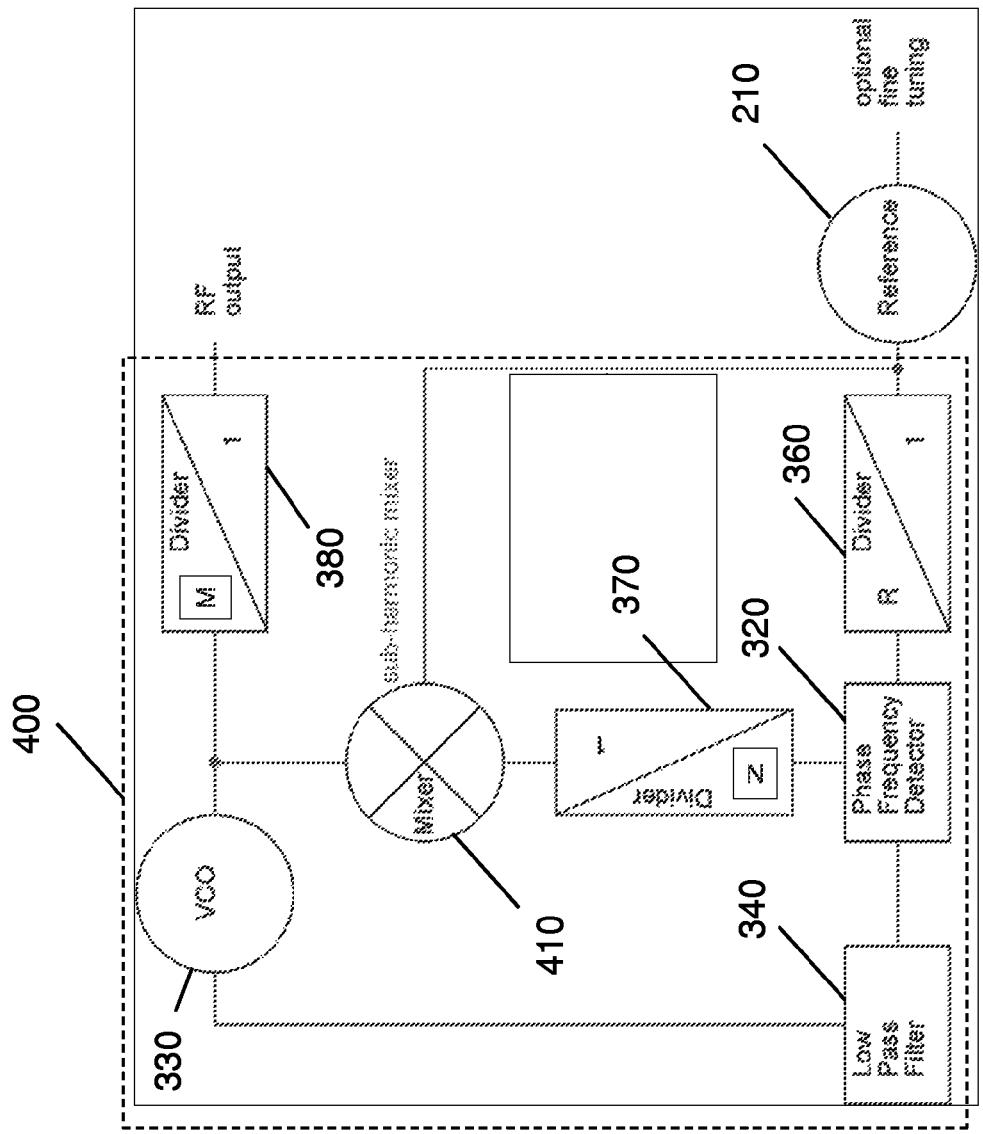
FIG. 4 illustrates an exemplary embodiment of another frequency synthesizer that can enable the system of FIG. 2 to operate using an arbitrary frequency of the oscillator of FIG. 2.

FIG. 4 illustrates a frequency synthesizer or phase lock loop device 400 that can be used with the oscillator 210 and system 275 of FIG. 2. In this embodiment, the frequency synthesizer 400 can include a phase lock loop that has the phase frequency detector 320, the voltage controllable oscillator 330, the low pass filter 340 and the integer dividers 360, 370 and 380 described with respect to the frequency synthesizer 300 of FIG. 3. The phase lock loop of frequency synthesizer 400 can also include a mixer 410, such as a subharmonic mixer in the feedback loop positioned between the voltage controllable oscillator 330 and the integer divider 370.

Based on this particular configuration with the use of the three integer dividers and the mixer 410, frequency synthesizer 400 can produce an output frequency $f_{out}$. The subharmonic mixer 410 can down convert the oscillator frequency with the harmonic ($k*f_{ref}$) which is closest to the oscillator frequency. The mixer output is equal to:

$$f_{mixout}=|f_{VCO}-k*f_{ref}|(\text{absolute value of the difference}) \quad [2]$$

due to the absolute value operation in the above equation there are two possible solutions satisfying the above equation which leads to:

$$f_{out}=f_{ref}*(k\pm N/R)/M \quad [3]$$

$f_{ref}$ is the arbitrary frequency generated by oscillator 210, N is a divider value for integer divider 370, R is a divider value for integer divider 360, M is a divider value for integer divider 380. Therefore the output frequency of the synthesizer is either $$f_{out}=f_{ref}*(k+N/R)/M (\text{low side injection}) \text{ or} \quad [4]$$

$$f_{out}=f_{ref}*(k-N/R)/M (\text{high side injection}) \quad [5]$$

where k=closest multiple of $f_{ref}$ to $f_{VCO}$ (k=integer ($f_{VCO}/f_{ref}$+0.5)) and k, N, R, M are integer numbers. Depending on the polarity of the phase detector (multiplicator+1 or −1), one of the above equations can be selected. Limiting the tuning range of the voltage controllable oscillator 330 close to a harmonic of the reference frequency can define or otherwise provide for the value of k.

In this embodiment, a frequency deviation consisting of the difference between a standard operating frequency (e.g., 26 MHz) and the output frequency, $f_{out}$, can be pre-determined based on varying the divider values for N, R and/or M, and/or variations in the value of k. Groupings of these values along with the corresponding frequency deviation can be stored (e.g., in the look-up table) for later use in configuring electronic equipment that utilizes the frequency synthesizer 400 with an oscillator where the arbitrary frequency, $f_{ref}$, of the oscillator is known. Fine tuning techniques can also be utilized with this embodiment for the output frequency, such as where the output frequency does not satisfy an operational threshold for the system 275. The fine tuning techniques can include adjusting a sampling rate of a DAC of the system 275 when the output frequency does not satisfy the operational threshold.

Frequency synthesizer 400 enables selection of values, including divider values for the plurality of integer dividers to achieve a desired output frequency without the need to utilize fractional dividing technology. Additionally, the desired output frequency of the frequency synthesizer 400 does not need to correspond to the smallest frequency deviation between the standard operating frequency and the output frequency, although in some cases it could be based only on the smallest frequency deviation. However, in other embodiments, other factors can be considered when selecting the desired output frequency, including reduction of spurious emissions, reduction of noise, reduction of power consumption, the frequency operating range of the voltage controllable oscillator, frequency operating range of one or more of the integer dividers, the frequency operating range of the phase frequency detector, and so forth.

Figure 5:
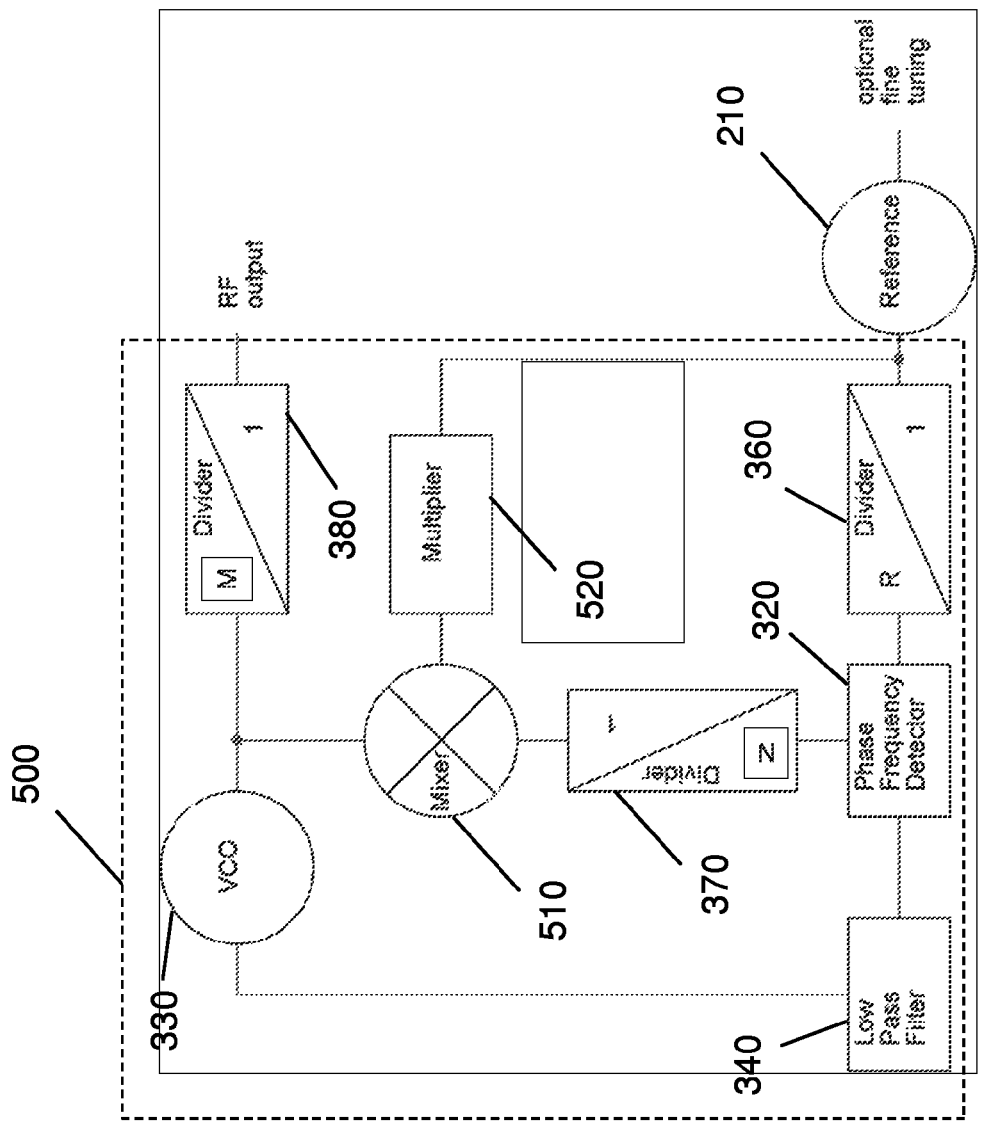
FIG. 5 illustrates an exemplary embodiment of another frequency synthesizer that can enable the system of FIG. 2 to operate using an arbitrary frequency of the oscillator of FIG. 2.

FIG. 5 illustrates a frequency synthesizer or phase lock loop device 500 that can be used with the oscillator 210 and system 275 of FIG. 2. In this embodiment, the frequency synthesizer 500 can include a phase lock loop that has the phase frequency detector 320, the voltage controllable oscillator 330, the low pass filter 340 and the integer dividers 360, 370 and 380 described with respect to the frequency synthesizer 300 of FIG. 3. The phase lock loop of frequency synthesizer 500 can also include a mixer 510 in the feedback loop positioned between the voltage controllable oscillator 330 and the integer divider 370. A multiplier 520 can be positioned in the loop between mixer 510 and the integer divider 360.

Based on this particular configuration with the use of the three integer dividers, the mixer 510 and the multiplier 520, frequency synthesizer 500 can produce an output frequency $f_{out}$ determined by the following formula:

$$f_{out}=f_{ref}*(k\pm N/R)/M \quad [6]$$

where $f_{ref}$ is the arbitrary frequency generated by oscillator 210, N is a divider value for integer divider 370, R is a divider value for integer divider 360, M is a divider value for integer divider 380, and where and N, R, M are integer numbers. The factor k can be defined by the multiplier 520. The phase detector polarity can define the sign (+ or −) in the above equation.

In this embodiment, a frequency deviation consisting of the difference between a standard operating frequency (e.g., 26 MHz) and the output frequency, $f_{out}$, can be pre-determined based on varying the divider values for N, R and/or M, and/or variations in the value of k. Groupings of these values along with the corresponding frequency deviation can be stored (e.g., in the look-up table) for later use in configuring electronic equipment that utilizes the frequency synthesizer 500 with an oscillator where the arbitrary frequency, $f_{ref}$, of the oscillator is known. Fine tuning techniques can also be utilized with this embodiment for the output frequency, such as where the output frequency does not satisfy an operational threshold for the system 275. The fine tuning techniques can include adjusting a sampling rate of a digital-to-analog converter of the system 275 when the output frequency does not satisfy the operational threshold.

Frequency synthesizer 500 enables selection of values, including divider values for the plurality of integer dividers to achieve a desired output frequency without the need to utilize fractional dividing technology. Additionally, the desired output frequency of the frequency synthesizer 500 does not need to correspond to the smallest frequency deviation between the standard operating frequency and the output frequency, although in some cases it could be based only on the smallest frequency deviation. However, in other embodiments, other factors can be considered when selecting the desired output frequency, including reduction of spurious emissions, reduction of noise, reduction of power consumption, the frequency operating range of the voltage controllable oscillator, frequency operating range of one or more of the integer dividers, the frequency operating range of the phase frequency detector, and so forth.

Figure 6:
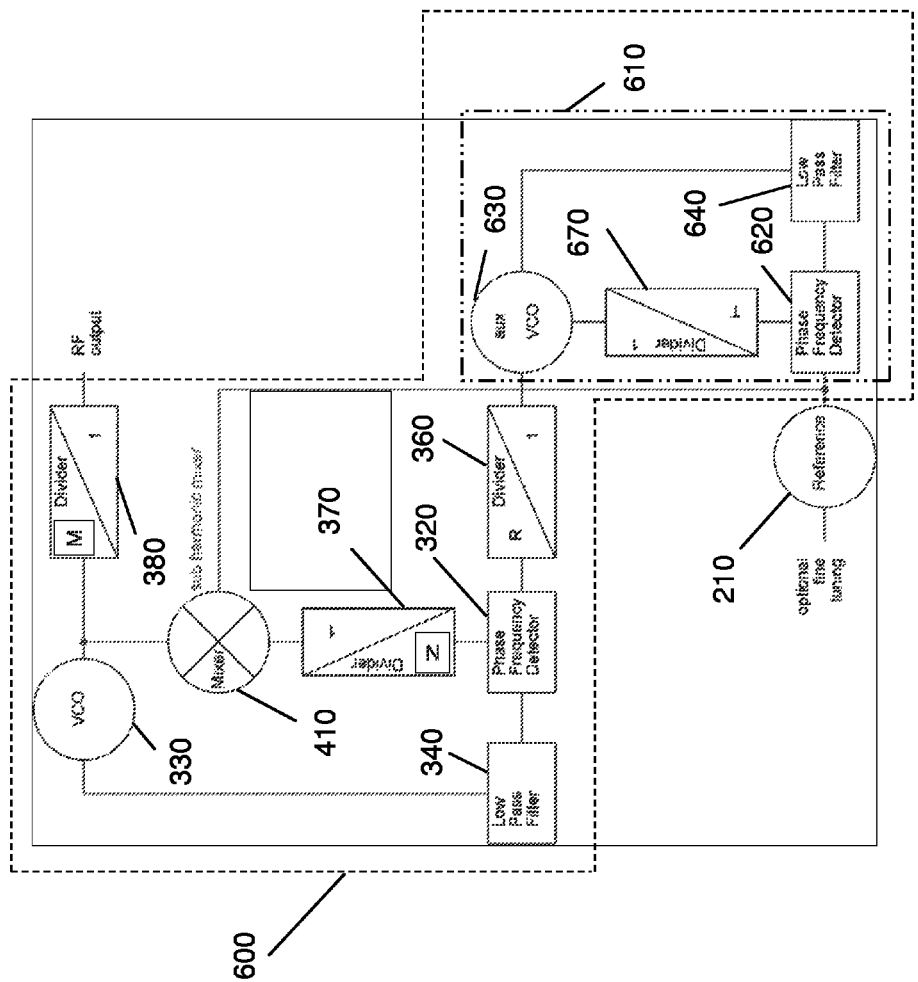
FIG. 6 illustrates an exemplary embodiment of another frequency synthesizer that can enable the system of FIG. 2 to operate using an arbitrary frequency of the oscillator of FIG. 2.

FIG. 6 illustrates a preferred embodiment of a frequency synthesizer or phase lock loop device 600 that can be used with the oscillator 210 and system 275 of FIG. 2. In this embodiment, the frequency synthesizer 600 can include a phase lock loop that has the phase frequency detector 320, the voltage controllable oscillator 330, the low pass filter 340 and the integer dividers 360, 370 and 380 described with respect to the frequency synthesizer 300 of FIG. 3. The phase lock loop of frequency synthesizer 600 can also include the mixer 410 of FIG. 4 that is positioned in the feedback loop between the voltage controllable oscillator 330 and the integer divider 370. Utilizing a pre-synthesizer circuit 610, the frequency synthesizer 600 can generate an intermediate reference frequency based on the arbitrary frequency generated by oscillator 210. The intermediate reference frequency can be provided by the pre-synthesizer circuit 610 to the integer divider 360 for processing as described above with respect to frequency synthesizer 400 of FIG. 4. The pre-synthesizer circuit 610 can include a phase frequency detector 620, a voltage controllable oscillator 630 and a low pass filter 640 therebetween. The pre-synthesizer circuit 610 can include an integer divider 670 in a feedback loop between the voltage controllable oscillator 630 and the phase frequency detector 620. In one embodiment, the pre-synthesizer 610 can operate without utilizing another integer divider between the phase frequency detector 620 and the oscillator 210.

Based on this particular configuration with the use of the three integer dividers, the mixer 410 and the pre-synthesizer circuit 610, frequency synthesizer 600 can produce an output frequency $f_{out}$ determined by the following formula:

$$f_{out} = f_{ref} * (k \pm T*N/R)/M \qquad [7]$$

where $f_{ref}$ is the arbitrary frequency generated by oscillator 210, N is a divider value for integer divider 370, R is a divider value for integer divider 360, M is a divider value for integer divider 380, T is a divider value for integer divider 670. k=closest multiple of $f_{ref}$ to $f_{VCO}$ (k=integer ($f_{VCO}/f_{ref}$+0.5)) and k, N, R, M and T are integer numbers. Depending on the polarity of the phase detector (multiplicator+1 or −1), one of the above equations can be selected. Limiting the tuning range of the voltage controllable oscillator 330 close to a harmonic of the reference frequency can define or otherwise provide for the value of k.

In this embodiment, a frequency deviation consisting of the difference between a standard operating frequency (e.g., 26 MHz) and the output frequency, $f_{out}$, can be pre-determined based on varying the divider values for N, R, M and/or T, and/or variations in k. Groupings of these values along with the corresponding frequency deviation can be stored (e.g., in the look-up table) for later use in configuring electronic equipment that utilizes the frequency synthesizer 600 with an oscillator where the arbitrary frequency, $f_{ref}$, of the oscillator is known. Fine tuning techniques can also be utilized with this embodiment for the output frequency, such as where the output frequency does not satisfy an operational threshold for the system 275. The fine tuning techniques can include adjusting a sampling rate of a digital-to-analog converter of the system 275 when the output frequency does not satisfy the operational threshold.

Frequency synthesizer 600 enables selection of values, including divider values for the plurality of integer dividers to achieve a desired output frequency without the need to utilize fractional dividing technology. Additionally, the desired output frequency of the frequency synthesizer 600 does not need to correspond to the smallest frequency deviation between the standard operating frequency and the output frequency, although in some cases it could be based only on the smallest frequency deviation. However, in other embodiments, other factors can be considered when selecting the desired output frequency, including reduction of spurious emissions, reduction of noise, reduction of power consumption, the frequency operating range of the voltage controllable oscillator, frequency operating range of one or more of the integer dividers, the frequency operating range of the phase frequency detector, and so forth.

Figure 7:
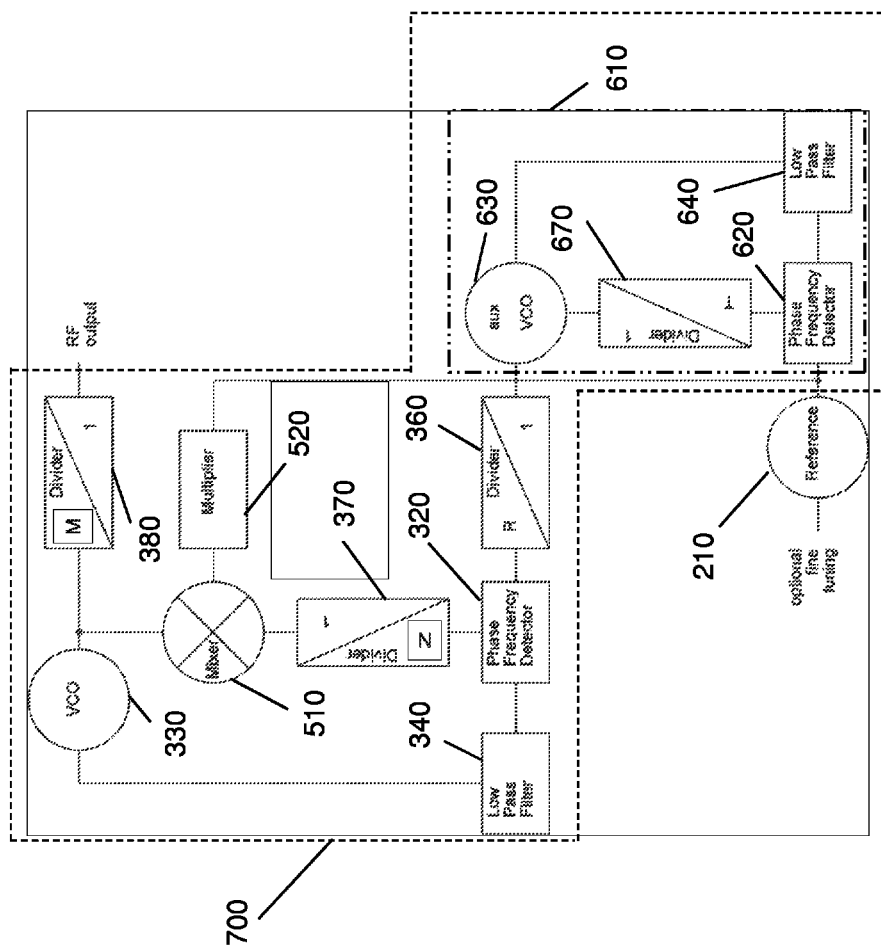
FIG. 7 illustrates an exemplary embodiment of another frequency synthesizer that can enable the system of FIG. 2 to operate using an arbitrary frequency of the oscillator of FIG. 2.

FIG. 7 illustrates a frequency synthesizer or phase lock loop device 700 that can be used with the oscillator 210 and system 275 of FIG. 2. In this embodiment, the frequency synthesizer 700 can include a phase lock loop that has the phase frequency detector 320, the voltage controllable oscillator 330, the low pass filter 340 and the integer dividers 360, 370 and 380 described with respect to the frequency synthesizer 300 of FIG. 3. The phase lock loop of frequency synthesizer 700 can also include the mixer 510 and the multiplier 520 of frequency synthesizer 500 of FIG. 5. Utilizing the pre-synthesizer circuit 610 described in FIG. 6, the frequency synthesizer 700 can generate an intermediate reference frequency based on the arbitrary frequency generated by oscillator 210.

Based on this particular configuration with the use of the three integer dividers, the mixer 510, the multiplier 520 and the pre-synthesizer circuit 610, frequency synthesizer 700 can produce an output frequency $f_{out}$ determined by the following formula:

$$f_{out} = f_{ref} * (k \pm T*N/R)/M \qquad [8]$$

where $f_{ref}$ is the arbitrary frequency generated by oscillator 210, N is a divider value for integer divider 370, R is a divider value for integer divider 360, M is a divider value for integer divider 380, T is a divider value for integer divider 670 and where and N, R, M and T are integer numbers. The factor k can be defined by the multiplier 520. The phase detector polarity can define the sign (+ or −) in the above equation.

In this embodiment, a frequency deviation consisting of the difference between a standard operating frequency (e.g., 26 MHz) and the output frequency, $f_{out}$, can be pre-determined based on varying the divider values for N, R, M and/or T, and/or variations in k. Groupings of these values along with the corresponding frequency deviation can be stored (e.g., in the look-up table) for later use in configuring electronic equipment that utilizes the frequency synthesizer 700 with an oscillator where the arbitrary frequency, $f_{ref}$, of the oscillator is known. Fine tuning techniques can also be utilized with this embodiment for the output frequency, such as where the output frequency does not satisfy an operational threshold for the system 275. The fine tuning techniques can include adjusting a sampling rate of a digital-to-analog converter of the system 275 when the output frequency does not satisfy the operational threshold.

Frequency synthesizer 700 enables selection of values, including divider values for the plurality of integer dividers to achieve a desired output frequency without the need to utilize fractional dividing technology. Additionally, the desired output frequency of the frequency synthesizer 700 does not need to correspond to the smallest frequency deviation between the standard operating frequency and the output frequency, although in some cases it could be based only on the smallest frequency deviation. However, in other embodiments, other factors can be considered when selecting the desired output frequency, including reduction of spurious emissions, reduction of noise, reduction of power consumption, the frequency operating range of the voltage controllable oscillator, frequency operating range of one or more of the integer dividers, the frequency operating range of the phase frequency detector, and so forth.

Figure 8:
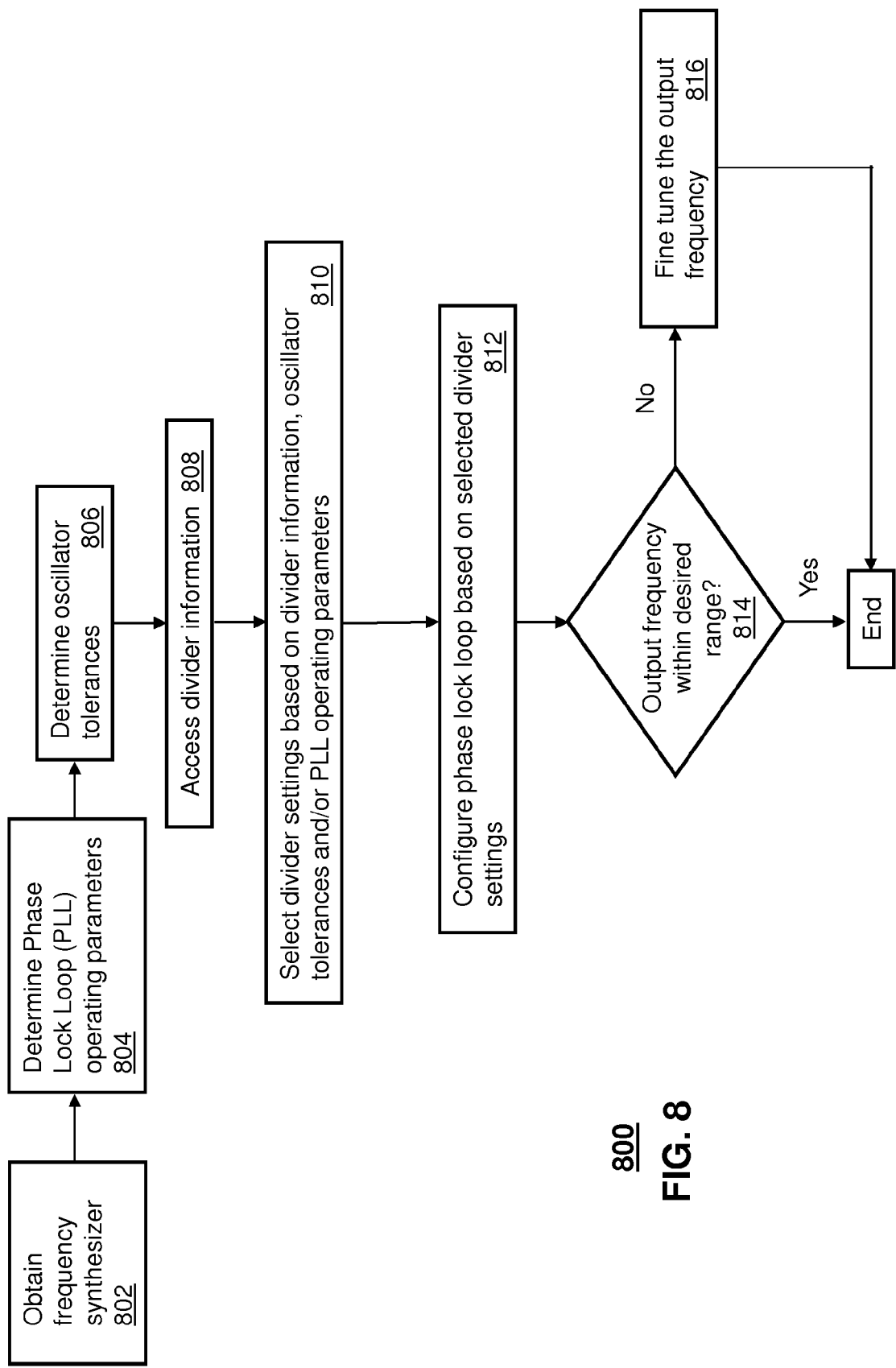
FIG. 8 illustrates a method of enabling a system to operate using an arbitrary frequency of an oscillator.

FIG. 8 depicts a method 800 for enabling a system in electronic equipment to operate utilizing an arbitrary frequency generated by an oscillator coupled with the system. Method 800 can provide for an output frequency to be supplied to the system in the electronic equipment that achieves or approximates a standard operating frequency used by the system. The particular number of oscillators, arbitrary frequencies and/or output frequencies can vary depending on the system and/or the electronic equipment. The particular steps can be performed by various devices and/or the same device. For example in one embodiment, the electronic equipment embodying the frequency synthesizer can perform all or a portion of the steps of method 800, such as through use of a controller of the electronic equipment to configure integer dividers of the frequency synthesizer. In another embodiment, a server can be used for performing all or a portion of the steps of method 800, such as through using the server to generate and store the divider information that can be accessed for divider selection and/or selecting the divider settings that are to be used for configuring the electronic equipment. In another embodiment, the steps can be distributed among different devices, such as the sever generating the pre-determined divider information and/or selecting the divider settings therefrom while the electronic equipment selects the divider settings from the pre-determined divider information and/or configures the frequency synthesizer from the selected divider settings.

It should be understood that the timing of the steps of method 800 can vary, such as one or more of the steps being done in different order and/or being done in parallel. Method 800 can be performed at varying times. For instance, one or more of the steps of method 800 can be performed during manufacture of the electronic equipment and one or more of the steps of method 800 can be performed during operation (e.g., in the field) of the electronic equipment. It is also contemplated by one or more of the exemplary embodiments that one or more of the steps of method 800 can be performed at either or both of a manufacturing phase and operational phase of the electronic equipment. In one embodiment, frequency synthesizer re-configuration can be performed during operation of the electronic equipment after an initial configuration was performed during the manufacturing process, such as during a final test of the electronic equipment. The re-configuration can be performed in response to a number of factors, including operational and/or environmental changes of the electronic equipment.

It should be further understood that the exemplary embodiments can be performed using more or less steps than is illustrated in method 800, and one or more of the steps of method 800 can be repeated until a desired outcome is achieved.

Method 800 can begin at 802 by obtaining a frequency synthesizer that is operable for coupling or otherwise connecting with an oscillator that generates an arbitrary frequency. The frequency synthesizer that is obtained can vary and can include one of synthesizers 300-700 described above, as well as variants of those frequency synthesizers, including combinations of components described with respect to one or more of the frequency synthesizers 300-700. For instance, the obtained frequency synthesizer can be a variant of frequency synthesizer 700, such as including a plurality of pre-synthesizer circuits 610. In one or more embodiments, the obtained frequency synthesizer can utilize integer dividers without utilizing fractional dividers or without otherwise using a fractional-n phase lock loop. In one or more of the embodiments, the obtained frequency synthesizer can enable a simplicity of configuration and a comparison at a higher frequency, while still generating narrow step sizes. It should be understood that the obtaining of the frequency synthesizer can include selecting of a frequency synthesizer that is intended to be used with a particular system in electronic equipment.

At 804, operating parameters of the phase lock loop or frequency synthesizer can be determined or otherwise obtained. The operational parameters can include a frequency range for a voltage controllable oscillator of the phase lock loop, a frequency range for a comparison frequency output by an integer divider, and/or a maximum frequency for a comparison frequency provided to a phase frequency detector. The operational parameters can include other information such as spurious emissions, noise, power consumption and so forth that is associated with operation of the frequency synthesizer and/or the electronic equipment utilizing the frequency synthesizer. At 806, the oscillator tolerances can be obtained or otherwise determined, including the arbitrary frequency that is generated by the oscillator.

At 808, divider information corresponding to the particular frequency synthesizer can be accessed. The divider information can be pre-determined data that is calculated for the frequency synthesizer based on the particular configuration and components used in the frequency synthesizer. The divider information can be in various formats, including a look-up table to facilitate selection of divider settings. In one embodiment, the divider information can be pre-determined for a plurality of different frequency synthesizers such as synthesizers 300-700 and/or a plurality of different oscillators (e.g., different arbitrary frequencies). The divider information and/or portions thereof can be stored at various locations, including in a database, in a server used for configuring frequency synthesizers and/or in a memory of electronic equipment that is being configured. In one embodiment, as designs for frequency synthesizer are updated, the divider information can be updated.

The divider information can include groups of integer divider settings and frequency deviations corresponding to each of the groups of integer divider settings for the configuration and components of the obtained frequency synthesizer. Each deviation of the frequency deviations can be based on a frequency differential between a standard operating frequency and an output frequency for the phase lock loop utilizing one group of integer divider settings from the groups of integer divider settings. In one embodiment, the divider information can be filtered based on the operating parameters. As an example based on utilizing the frequency synthesizer 300 of FIG. 3, there are three integer dividers 360, 370 and 380 with corresponding divider values R, N and M. There could be an infinite number of combinations of R, N and M, however many of these combinations and/or divider values are not practical or usable for various reasons, including the operating parameters of the components of the frequency synthesizer. Thus, the number of solutions for frequency deviations can be filtered down based on those operating parameters.

At 810, a selection of divider settings can be made from the divider information. The selection can be made based on a number of factors including reducing the frequency deviation between the output frequency and the standard operating frequency of the system. While reducing the frequency deviation can be weighed heavily, including being the only factor in the selection, one or more embodiments contemplate the reduction of the frequency deviation being one of a plurality of factors in selecting the divider settings. In one or more embodiments, the group of divider settings that are selected from the divider information can include a larger frequency deviation than one or more other available groups of divider settings. In this example, other criteria, such as spurious emissions, noise, and/or power consumption can be considered, which may or may not outweigh minimizing the frequency deviation.

In one embodiment, other methods and/or components for reducing the frequency deviation can be considered in the selection of the group of divider settings. As an example, fine tuning that is available to account for or otherwise offset a particular frequency deviation, such as, but not limited to, ±10 ppm, can be used as a factor in selecting the divider settings. For instance, a selection of a first group of divider settings that results in a frequency deviation of ±9 ppm may be selected over a second group of divider settings that results in a frequency deviation of ±3 ppm where the first group of divider settings outweighs the second group of divider settings based on one or more of spurious emissions, noise, and power consumption, and where the fine tuning can be used to achieve a desired standard operating frequency. It should be understood that the frequency deviations described in this example are exemplary.

At 812, the frequency synthesizer or phase lock loop device can be configured based on the selected divider settings. In one embodiment, the configuration can occur during final testing of the frequency synthesizer and/or the electronic equipment embodying the frequency synthesizer. The configuration can be performed in a number of different ways, such as programming a controller of the electronic equipment to configure the frequency synthesizer with the divider settings.

At 814, fine tuning of the electronic equipment can be performed based on determining whether the output frequency of the frequency synthesizer falls within a desired range or otherwise meets an acceptable tolerance. For instance, if the acceptable deviation between the output frequency and the standard operating frequency of the electronic equipment is 1.5 ppm then a selected and configured group of divider settings resulting in a frequency deviation of 1.0 ppm would be acceptable and no fine tuning would be necessary. If on the other hand, a selected and configured group of divider settings resulting in a frequency deviation of greater than 1.5 ppm would not be acceptable and fine tuning can be performed at step 816.

The fine tuning performed can be based on various methods and components, which enable the electronic equipment to operate utilizing the output frequency generated based on the selected and configured divider settings of the frequency synthesizer. In one embodiment, the fine tuning can be performed by generating a digital data signal that has digital data, and sampling the digital data signal with a DAC using a sampling rate selected to induce a shift of the digital data in a frequency domain, where the sampling results in an analog signal. The analog signal can be upconverted using the oscillating reference signal having the arbitrary frequency to generate an upconverted signal including data corresponding to the digital data.

In another embodiment, the fine tuning can be performed by generating a digital data signal that has digital data, and shifting the digital data in a frequency domain using a DSP. The shifted digital data can be sampled with the DAC to produce an analog signal, and the analog signal can be upconverted using the oscillating reference signal having the arbitrary frequency to generate an upconverted signal including data corresponding to the digital data. Shifting the digital data in the frequency domain can include shifting the digital data by a frequency amount selected to account for a deviation of the arbitrary frequency from the standard operating frequency. Other techniques of fine tuning are also contemplated by the present disclosure, such as using an Analog-to-Digital Converter (ADC) and selecting a sampling rate associated with the ADC to offset the frequency deviation in a manner similar as described with respect to the DAC fine tuning.

Upon reviewing the aforementioned embodiments, it would be evident to an artisan with ordinary skill in the art that the above embodiments of method 800 can be modified, reduced, rearranged, or enhanced without departing from the scope and spirit of the claims described below. For example, in one embodiment the electronic equipment can be provided with knowledge of the oscillator tolerances, such as the arbitrary frequency, and the electronic equipment can perform an algorithm to select and configure its frequency synthesizer based on consulting pre-determined divider information (e.g. stored in a memory of the electronic equipment) that allows for selection of divider settings based on only the arbitrary frequency value. In another embodiment, the electronic equipment can be provided with the divider settings for configuring the frequency synthesizer without being provided with other information related to the configuration process, such as the oscillator's arbitrary frequency, the divider information and the operating parameters of the phase lock loop.

In another embodiment, an initial configuration of the frequency synthesizer can be performed during the manufacturing process and then subsequent reconfigurations of the frequency synthesizer can be performed in response to changes in operation of the electronic equipment. For instance, the electronic equipment may initially perform better using a first group of divider settings where other factors (e.g., spurious settings, noise and/or power consumption) are considered but deemed within tolerances for the selected first group of divider settings. Due to changes in the electronic equipment, such as additions or removals of components, battery life, or changes in the environment or operating conditions of the electronic equipment, the other factors (e.g., spurious settings, noise and/or power consumption) may no longer be deemed within accepted tolerances for the selected first group of divider settings and a reconfiguration to a second group of divider settings may be implemented. In one embodiment, the electronic equipment can perform all or a portion of the steps of method 800 to perform the reconfiguration of the frequency synthesizer. In another embodiment, the electronic equipment can be provided with more than one group of divider settings and can select from the other groups of divider settings to reconfigure the frequency synthesizer. As an example, the electronic equipment can be provided with an algorithm for selecting from among the groups of divider settings, such as monitoring for spurious settings, noise and/ or power consumption and reconfiguring by selecting from among the plurality of groups of divider settings (where the plurality of groups were selected based on one or more of the steps of method 800) based on changes to these factors during operation of the electronic equipment.

Figure 9:
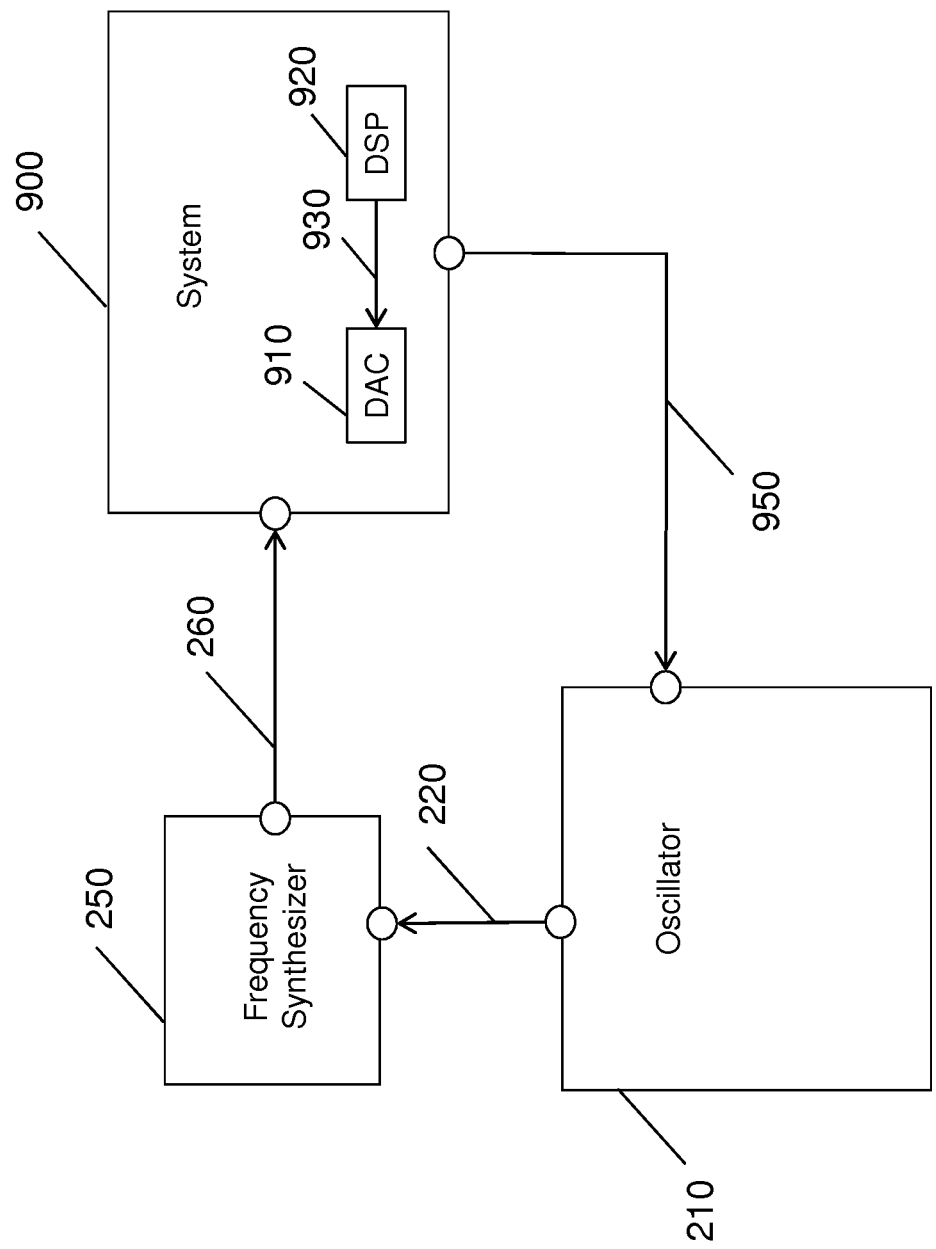
FIG. 9 illustrates an exemplary embodiment of another frequency synthesizer that can enable a system to operate using an arbitrary frequency of an oscillator.

Referring additionally to FIG. 9, fine tuning can be performed in one embodiment using a DAC 910 and a DSP 920. The DAC 910 can be configured to receive a digital signal 930 from DSP 920 including digital data to be transmitted. The DAC 910 can convert the digital signal 930 to an analog signal, which may then be up-converted by mixing with oscillating reference signal 220. If the oscillating reference signal used for the up-conversion differs from a standard oscillator frequency, the data of the resulting up-converted signal may be shifted in the frequency domain relative to the intermediate frequency. Such a shift may be undesirable, and may be accounted for in some embodiments by sampling the digital data signal 930 from the DSP 920 using a suitable sampling rate of the DAC 910 to account for the frequency shift which is induced during the up-conversion process using the arbitrary frequency reference signal. According to one embodiment, the sampling rate of the DAC 910 may be selected to approximately match the frequency shift of the intermediate frequency introduced during up-conversion. It should be appreciated that according to one embodiment if the arbitrary frequency of the oscillating reference signal used in the up-conversion process is greater than the expected standard oscillator frequency, then the sampling rate of the DAC 910 may be lowered compared to what would be appropriate if the oscillating reference signal had the standard oscillator frequency, and vice versa.

In another embodiment illustrated in FIG. 9, the system 900 can provide a tuning signal(s) 950 to the oscillator 210 to influence the frequency of the oscillating reference signal 220. The tuning signal 950 is depicted in broken lines to illustrate that the use of the tuning signal with the other exemplary embodiments described with respect to FIGS. 1-9 can be an optional technique, which may or may not be employed. The value of the tuning signal 950 may be selected to tune the oscillator 210 such that the output signal 260 generated by the frequency synthesizer 250 from the reference signal 220 has a standard operating frequency (or is within acceptable tolerances thereof) rather than the arbitrary frequency which oscillator 210 is configured to produce, or so that the output frequency 260 has a frequency enabling the system 900 itself to generate a desired standard operating frequency, such as through use of the DAC and selection of a sampling rate. The form of tuning signal 950, and the manner and timing in which it is provided to the oscillator 210, are not limited. The tuning signal 950 can be an analog tuning voltage or a digital signal. The tuning signal 950 may be applied continuously, for example as an analog tuning voltage, and may vary regularly to account for relatively small deviations of the frequency of output frequency 260 from a target or desired frequency.

The system 900 may include any suitable circuitry for providing the tuning signal 950, and may include any suitable circuitry for determining the values of those signals. According to one embodiment, the system 900 may determine suitable values for tuning signal 950 by comparison of the frequency of the output signal 260 to a reference frequency, such as a radio frequency signal of known frequency received by a device of which apparatus 300 forms a part (e.g., a cellular telephone). According to another embodiment, the frequency of the output signal 260 provided by the frequency synthesizer 250 may be directly measured, for example using a frequency analyzer or any other suitable technique. Such measurement may be made after manufacture of the oscillator or at any other suitable time. The measured frequency may be compared to a target value, from which suitable values for tuning signal 950 to adjust the arbitrary frequency of oscillating reference signal 220.

In a first example of the process utilized in all or a portion of method 800, the frequency synthesizer obtained or otherwise utilized with the electronic equipment is that of frequency synthesizer 300 of FIG. 3. Frequency synthesizer 300 can include three integer dividers 360, 370 and 380, which can be configured with divider values R, N and M, respectively. As explained above, the output frequency, $f_{out}$ is represented by equation [1] which is $f_{out}=f_{ref}*N/(R*M)$. In this example, the standard operating frequency for the system is 26 MHz while the oscillator to be used in the electronic equipment is determined to be providing an arbitrary reference frequency $f_{ref}$ of 125.322323 MHz. If an R divider of 125322323 was utilized in a contemporary device to generate the exact 26 MHz output frequency, the electronic equipment would perform poorly due to use of a large R divider.

In this example, operating parameters of the phase lock loop can be determined or otherwise identified, such as the VCO 330 being tunable between 4 GHz and 4.5 GHz and the desired output frequency of the R divider being in the range between 5 MHz and 20 MHz (where the lower bound is due to performance requirements and spurious emissions of the phase lock loop while the higher bound is due to operational limitations of the phase frequency detector 320).

Computing the possible solutions for equation [1] which are in compliance with the operating parameters of the phase lock loop and utilize a small R divider value, results in 1251 combinations of divider settings. These solutions are based on the known arbitrary reference frequency of the oscillator 210 and provide an output frequency $f_{out}$ that is relatively close to the standard operating frequency for the electronic equipment as shown below in Table 1, which illustrates frequency differentials within 23.4 ppm:

TABLE 1

| R Divider Value | N Divider Value | M Divider Value | Frequency Differential |
|---|---|---|---|
| 7 | 228 | 157 | −17.9 ppm |
| 14 | 456 | 157 | −17.9 ppm |
| 17 | 589 | 167 | 11.5 ppm |
| 19 | 678 | 172 | 6.3 ppm |
| 20 | 639 | 154 | 12.0 ppm |
| 21 | 684 | 157 | −17.9 ppm |
| 21 | 745 | 171 | −9.3 ppm |
| 23 | 773 | 162 | −19.0 ppm |
| 25 | 861 | 166 | 23.4 ppm |

The minimum frequency deviation for the solutions in Table 1 is 6.3 ppm, which, with or without fine tuning, may be acceptable for use as an output frequency of the frequency synthesizer 300.

If the operating parameters were adjusted to allow for a lower comparison frequency on the phase frequency detector 320, such as, for example 2 MHz, the possible solutions for equation [1] which are in compliance with the adjusted operating parameters of the phase lock loop and utilize a small R divider value, results in 7826 combinations of divider settings. These solutions are based on the known arbitrary reference frequency of the oscillator 210 and provide an output frequency $f_{out}$ that is relatively close to the standard operating frequency for the electronic equipment as shown below in Table 2, which illustrates frequency differentials within 5 ppm:

TABLE 2

| R Divider Value | N Divider Value | M Divider Value | Frequency Differential |
|---|---|---|---|
| 26 | 917 | 170 | 5.0 ppm |
| 36 | 1195 | 160 | 1.2 ppm |
| 41 | 1395 | 164 | 3.7 ppm |
| 41 | 1412 | 166 | −5.0 ppm |
| 46 | 1651 | 173 | −4.1 ppm |
| 48 | 1673 | 168 | 1.2 ppm |
| 52 | 1834 | 170 | 5.0 ppm |
| 60 | 2029 | 163 | −4.0 ppm |

The minimum frequency deviation for the solutions in Table 2 is 1.2 ppm, which, with or without fine tuning, may be acceptable for use as an output frequency of the frequency synthesizer 300. However, due to the adjusted operating parameters, performance associated with phase noise may be decreased.

In a second example using the frequency synthesizer 300 of FIG. 3, but where the arbitrary reference frequency $f_{ref}$ is 124.727031 MHz (which is worse than in example 1) and where the operational parameters are further adjusted such that the minimum frequency provided to the phase frequency detector is 5 MHz, the possible solutions for equation [1] which are in compliance with the further adjusted operating parameters of the phase lock loop and utilize a small R divider value, results in 1154 combinations of divider settings. These solutions are based on the known arbitrary reference frequency of the oscillator 210 and provide an output frequency $f_{out}$ that is relatively close to the standard operating frequency for the electronic equipment as shown below in Table 3, which illustrates frequency differentials within 15.2 ppm:

TABLE 3

| R Divider Value | N Divider Value | M Divider Value | Frequency Differential |
|---|---|---|---|
| 11 | 360 | 157 | −6.0 |
| 13 | 439 | 162 | −15.2 |
| 16 | 557 | 167 | 13.8 |
| 16 | 567 | 170 | 3.2 |
| 16 | 577 | 173 | −7.0 |
| 17 | 567 | 160 | 3.2 |
| 22 | 720 | 157 | −6.0 |

The minimum frequency deviation for the solutions in Table 3 is 3.2 ppm, which, with or without fine tuning, may be acceptable for use as an output frequency of the frequency synthesizer 300.

In the first and second examples as well as one or more other embodiments described herein, there is a high probability that method 800 can find a divider setting which allows for generating an output frequency that is relatively close to the standard operating frequency, including within acceptable tolerances that may not require further fine tuning, such as through use of the DAC as described with respect to FIG. 9. However, other reasons may warrant not utilizing the minimum frequency deviation, such as spurious emissions, noise, power consumption and so forth.

In one embodiment, a MEMS device can be utilized as the oscillator for providing the arbitrary frequency to one or more of the frequency synthesizers described herein, where strong tuning linearity is enabled over a large tuning range. Examples of such oscillators are described in U.S. Patent Application Publication No. 20100182102 which was filed on Dec. 16, 2009 and U.S. application Ser. No. 13/186,428 filed on Jul. 19, 2011, the disclosures of each of these applications are hereby incorporated by reference. This exemplary embodiment can be tunable by +−50 ppm with extreme linearity. Based on this linearity, a DAC can be used to do fine tuning of the device to the desired output frequency.

In one or more exemplary embodiments, for a given output frequency and the knowledge of the manufacturing tolerances of the resonator, the optimum or desired divider settings can be pre-determined for all possible resonator frequencies (e.g., less than 50 k) once and the results stored or otherwise maintained. During final test, a look-up table can be utilized to program the individual device with the optimum or desired divider settings, and a fine tuning to the desired frequency can be performed, such as with an integrated DAC.

In one embodiment utilizing a subharmonic mixer, the VCO can be forced close to the desired frequency. For instance, this can be done by limiting the tuning range or by presetting the frequency (e.g., using a DAC) close to the desired value before the PLL is turned on.

The exemplary embodiments describe utilizing frequency synthesizers with components and techniques that do not require utilizing Fractional-N methodology. However, the present disclosure contemplates one or more embodiments utilizing Fractional-N methodology, such as in combination with or in place of the components and steps described with respect to FIGS. 1-9.

Figure 10:
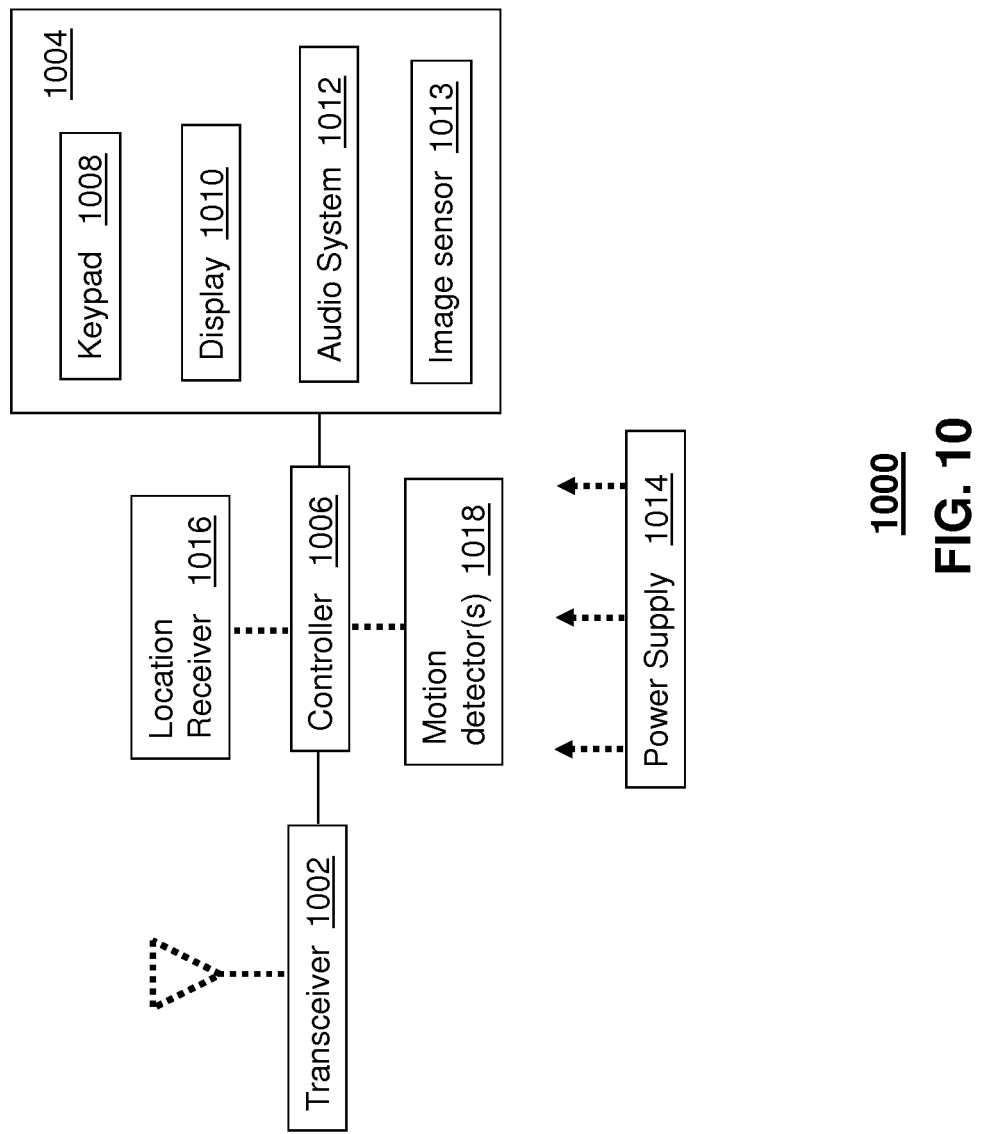
FIG. 10 illustrates an exemplary embodiment of electronic equipment that can utilize the frequency synthesizers and the methods of frequency synthesizing of FIGS. 1-9.

It should also be evident from the present disclosure that the frequency synthesizers and related components and techniques can be used in many applications including computing devices such as shown in FIG. 10. FIG. 10 depicts a computing device that can utilize one or more of the frequency synthesizers and the oscillators as described herein. The computing device 1000 can comprise a wireline and/or wireless transceiver 1002 (herein transceiver 1002), a user interface (UI) 1004, a power supply 1014, a location receiver 1016, motion detector(s) 1018, and a controller 1006 for managing operations thereof. The transceiver 1002 can support short-range or long-range wireless access technologies such as infrared, Bluetooth, WiFi, Digital Enhanced Cordless Telecommunications (DECT), or cellular communication technologies, just to mention a few. Cellular technologies can include, for example, CDMA-1X, UMTS/HSDPA, GSM/GPRS, TDMA/EDGE, EV/DO, WiMAX, SDR, LTE, as well as other next generation wireless communication technologies as they arise. The transceiver 1002 can also be adapted to support circuit-switched wireline access technologies (such as PSTN), packet-switched wireline access technologies (such as TCPIP, VoIP, etc.), and combinations thereof.

The UI 1004 can include a depressible or touch-sensitive keypad 1008 with a navigation mechanism such as a roller ball, a joystick, a mouse, or a navigation disk for manipulating operations of the computing device 1000. The keypad 1008 can be an integral part of a housing assembly of the computing device 1000 or an independent device operably coupled thereto by a tethered wireline interface (such as a USB cable) or a wireless interface supporting for example Bluetooth. The keypad 1008 can represent a numeric keypad commonly used by phones, and/or a QWERTY keypad with alphanumeric keys. The UI 1004 can further include a display 1010 such as monochrome or color LCD (Liquid Crystal Display), OLED (Organic Light Emitting Diode) or other suitable display technology for conveying images to an end user of the computing device 1000. In an embodiment where the display 1010 is touch-sensitive, a portion or all of the keypad 1008 can be presented by way of the display 1010 with navigation features.

The UI 1004 can also include an audio system 1012 that utilizes common audio technology for conveying low volume audio (such as audio heard only in the proximity of a human ear) and high volume audio (such as speakerphone for hands free operation). The audio system 1012 can further include a microphone for receiving audible signals of an end user. The audio system 1012 can also be used for voice recognition applications. The UI 1004 can further include an image sensor 1013 such as a charged coupled device (CCD) camera for capturing still or moving images.

The power supply 1014 can utilize common power management technologies such as replaceable and rechargeable batteries, supply regulation technologies, and charging system technologies for supplying energy to the components of the computing device 1000 to facilitate long-range or short-range portable applications. The location receiver 1016 can utilize common location technology such as a global positioning system (GPS) receiver capable of assisted GPS for identifying a location of the computing device 1000 based on signals generated by a constellation of GPS satellites, thereby facilitating common location services such as navigation.

The computing device 1000 can use motion detectors 1018 such as accelerometers, gyroscopes and a compass to determine an orientation of the device in three-dimensions (3D). The controller 1006 can also utilize computing technologies such as a state machine, a microprocessor, a DSP, and/or a video processor with associated storage memory such as Flash, ROM, RAM, SRAM, DRAM or other storage technologies.

Several of the aforementioned technologies of the computing device 1000 may require a reference clock signal such as one generated by an oscillator or mechanical resonating structure described herein for proper operation. The exemplary frequency synthesizers can be used to adjust the resonating frequency generated by a mechanical resonating structure to a desired frequency used by components of the computing device 1000. Additionally, clock distribution technology can be used to distribute clock signals to such components. For example, the transceiver 1002 may require reference oscillators for mixers of the receiver and transmitter sections. The location receiver 1016 may also require a precision oscillator to generate coordinate measurements from a constellation of satellite signals. The exemplary frequency synthesizer and the mechanical resonating structure can also be used to support the functions of the motion detectors 1018. Charging system technologies of the power supply 1014 can also require a timing reference. Computing device 1000 (utilizing one or more frequency synthesizers as described herein) in whole or in part can be integrated into base stations, satellite systems, WiFi routers, cell phones, watches, clocks, laptop computers, desktop computers, tablets, gaming consoles with 3D gaming accessories, and automobiles. It should be apparent that there may be numerous applications for the frequency synthesizer which cannot all be described in the present disclosure for practical reasons. Nonetheless, such applications are contemplated by the present disclosure and considered within the scope of the claims described below.

It should also be understood that the various embodiments shown in the Figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present disclosure, but not necessarily in all embodiments. Consequently, appearances of the phrases "in one embodiment," "in an embodiment," or "in some embodiments" in various places throughout the Specification are not necessarily referring to the same embodiment. Furthermore, the particular features, structures, materials, or characteristics can be combined in any suitable manner in one or more embodiments (e.g., one or more components from a first embodiment can be used with all or some of the components of a second embodiment).

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list; all of the items in the list; and any combination of the items in the list.

Having thus described several embodiments of this disclosure, it is to be appreciated that various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A method, comprising:

obtaining a phase lock loop device operable for coupling with an oscillator that generates an arbitrary frequency, wherein the phase lock loop device comprises a plurality of integer dividers without utilizing a fractional divider;

accessing divider information utilizing a processor, the divider information comprising groups of integer divider settings and frequency deviations corresponding to each of the groups of integer divider settings, wherein the groups of integer divider settings are for at least three integer dividers of the phase lock loop device, and wherein each deviation of the frequency deviations is based on a frequency differential between a standard operating frequency and an output frequency for the phase lock loop utilizing one group of integer divider settings from the groups of integer divider settings;

determining operating parameters for the phase lock loop device;

selecting a desired group of integer divider settings from the groups of integer divider settings based on the frequency differential and the operating parameters of the phase lock loop device, wherein a first integer divider of the at least three integer dividers is coupled to an output of a voltage controlled oscillator of the phase lock loop device, wherein the phase lock loop device includes a feedback loop having a mixer and a second integer divider of the at least three integer dividers, wherein the feedback loop is coupled to the output of the voltage controlled oscillator and a phase frequency detector, wherein the phase lock loop device utilizes a pre-synthesizer circuit that is coupled between the oscillator and a third integer divider of the at least three integer dividers, wherein the pre-synthesizer circuit comprises an auxiliary voltage controlled oscillator, an auxiliary phase frequency detector and a single fourth integer divider without utilizing a fractional divider, wherein the single fourth integer divider is in a pre-synthesizer feedback loop coupled between the auxiliary voltage controlled oscillator and the auxiliary phase frequency detector, and wherein the pre-synthesizer circuit provides the third integer divider with an intermediate reference frequency;

providing, from the phase lock loop device, a modified output frequency signal to a system according to configuring of the phase lock loop device based on the desired group of integer divider settings, wherein the system is coupled to an output of the phase lock loop device;

receiving a radio frequency signal of known frequency;

generating a tuning signal based on a comparison of the radio frequency signal with the modified out frequency signal; and providing the tuning signal to the oscillator to enable adjustment of the arbitrary frequency by the oscillator.

2. The method of claim 1, comprising configuring the phase lock loop device based on the selected desired group of integer divider settings to enable adjustment of the arbitrary frequency to the output frequency.

3. The method of claim 2, wherein the selecting of the desired group of integer divider settings comprises selecting a first group of integer divider settings that corresponds to a first frequency differential that is larger than a second frequency differential corresponding to a second group of integer divider settings.

4. The method of claim 3, wherein the configuring of the phase lock loop device utilizing the first group of integer divider settings provides a lower level of spurious emission than a configuring of the phase lock loop device utilizing the second group of integer divider settings.

5. The method of claim 2, comprising:
determining if the output frequency for the configured phase lock loop device satisfies an operating threshold of an electronic device; and
adjusting a sampling rate of a digital-to-analog converter of the electronic device when the output frequency does not satisfy the threshold.

6. The method of claim 1, wherein the pre-synthesizer circuit comprises a low pass filter coupled between the auxiliary voltage controlled oscillator and the auxiliary phase frequency detector.

7. The method of claim 1, wherein the system is a cellular phone.

8. The method of claim 1, wherein a low pass filter is coupled between the phase frequency detector and the voltage controlled oscillator.

9. The method of claim 1, wherein a multiplier is coupled between the mixer and the oscillator.

10. The method of claim 1, wherein the operating parameters of the phase lock loop device comprise a frequency range for the voltage controlled oscillator of the phase lock loop device.

11. The method of claim 1, wherein the operating parameters of the phase lock loop device comprise a frequency range for a comparison frequency output by the third integer divider of the at least three integer dividers, wherein the third integer divider is coupled between an output of the pre-synthesizer circuit and an input of the phase frequency detector.

12. The method of claim 1, wherein the operating parameters of the phase lock loop device comprise a maximum frequency for a comparison frequency provided to the phase frequency detector of the phase lock loop device, wherein the phase frequency detector is coupled between the third integer divider and a low pass filter.

13. A method, comprising:
selecting divider settings using a processor, the divider settings being selected from pre-determined divider information for a plurality of integer dividers of a phase lock loop device of a frequency synthesizer, wherein the frequency synthesizer is operable to receive an arbitrary frequency generated by an oscillator, wherein the frequency synthesizer operates without utilizing a fractional divider, wherein the pre-determined divider information comprises frequency deviations corresponding to groups of integer divider settings for the phase lock loop device, wherein each deviation of the frequency deviations is based on a frequency differential between a standard operating frequency and an output frequency for the phase lock loop utilizing one group of integer divider settings from the groups of integer divider settings;

configuring the phase lock loop device based on the selected divider settings;

providing, from the phase lock loop device, a modified output frequency signal to a system according to the configuring of the phase lock loop device, wherein the system is coupled to an output of the frequency synthesizer;

receiving a radio frequency signal of known frequency from a remote source;

generating a tuning signal based on a comparison of the radio frequency signal with the modified out frequency signal; and providing the tuning signal to the oscillator to enable adjustment of the arbitrary frequency by the oscillator.

14. The method of claim 13, wherein the frequency synthesizer utilizes a pre-synthesizer circuit having a single integer divider in a pre-synthesizer feedback loop, wherein the pre-synthesizer circuit is coupled between the oscillator and the phase lock loop device.

15. The method of claim 13, wherein the tuning signal is a digital signal that is periodically provided to the oscillator and further comprising:
determining if the output frequency for the configured phase lock loop device satisfies an operating threshold of an electronic device; and
adjusting a sampling rate of a digital-to-analog converter of the electronic device when the output frequency does not satisfy the threshold.

16. The method of claim 13, comprising:
determining operating parameters for the phase lock loop device; and
selecting the divider settings based on a desired frequency differential and the operating parameters of the phase lock loop device, wherein the operating parameters of the phase lock loop device comprise at least one of:
a frequency range for a voltage controllable oscillator of the phase lock loop device, a frequency range for a comparison frequency output by an integer divider of the plurality of integer dividers, or a maximum frequency for a comparison frequency provided to a phase frequency detector of the phase lock loop device.

* * * * *